US007609188B2

(12) United States Patent
Di Giandomenico et al.

(10) Patent No.: US 7,609,188 B2
(45) Date of Patent: Oct. 27, 2009

(54) MULTI-STANDARD ANALOG-TO-DIGITAL DATA CONVERSION

(75) Inventors: Antonio Di Giandomenico, Velden am Worthersee (AT); David San Segundo Bello, Villach (AT); Andreas Wiesbauer, Portschach (AT); Susana Paton Alvarez, Madrid (ES); Jorg Hauptmann, Wernberg (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 11/944,174

(22) Filed: Nov. 21, 2007

(65) Prior Publication Data

US 2009/0128384 A1 May 21, 2009

(51) Int. Cl.
    *H03M 3/02* (2006.01)
(52) U.S. Cl. ....................................................... 341/143
(58) Field of Classification Search .................. 341/143
    See application file for complete search history.

(56) References Cited

U.S. PATENT DOCUMENTS

| 5,068,661 | A | 11/1991 | Kaneaki et al. |
| 5,124,703 | A | 6/1992 | Kaneaki et al. |
| 6,496,128 | B2 * | 12/2002 | Wiesbauer et al. .......... 341/143 |
| 6,577,258 | B2 * | 6/2003 | Ruha et al. ................... 341/143 |
| 6,765,517 | B1 * | 7/2004 | Ali .............................. 341/143 |
| 6,894,632 | B1 * | 5/2005 | Robinson ..................... 341/143 |
| 2004/0036640 | A1 * | 2/2004 | Kawamura ................... 341/143 |
| 2005/0190092 | A1 * | 9/2005 | Gulati et al. ................. 341/155 |
| 2006/0038709 | A1 * | 2/2006 | Lu et al. ...................... 341/143 |
| 2006/0164274 | A1 * | 7/2006 | Nakakita et al. ............. 341/143 |

OTHER PUBLICATIONS

Xu, Gang et al., A Programmable Analog-to-Digital Converter, Proceedings of the 2004 International Symposium on Circuits and Systems, May 2004, IEEE, vol. 1 pp. 585-588.*
Tiew et al., Novel Implementation OF 6th Order MASH Delta-Sigma Modulators For Wideband And Multi-Standard Applications, international Symposium on VLSI Technology, Systems, and Applications, 2001. Proceedings of Technical Papers.2001 On pp. 129-132.*
Xotta et al. A Multi-Mode Delta- Sigma Analog-to-Digital Converter for GSM, UMTS and WLAN, IEEE International Symposium on Circuits and Systems, ISCAS 2005, Publication Date: May 23-26, 2005On pp. 2551-2554 vol. 3.*
Del Rio et al., High-Order Cascade Multibit Sigma-Delta Modulators for xDSL Applications, ISCAS 2000—IEEE International Symposium on Circuits and Systems, May 28-31, 2000, Geneva, Switzerland, Publication Date: 2000 vol. 2, On pp. 37-40 vol. 2.*
Breems, et al., "A Cascaded Continuous-Time Modulator With 67-dB Dynamic Range in 10-MHz Bandwidth", IEEE Journal of Solid-State Circuits, vol. 39, No. 12, Dec. 2004.

* cited by examiner

*Primary Examiner*—Howard Williams
(74) *Attorney, Agent, or Firm*—Lee & Hayes, PLLC

(57) ABSTRACT

Implementations related to multi-standard digital subscriber line analog-to-digital data conversion are described.

19 Claims, 8 Drawing Sheets

US 7,609,188 B2

MULTI-STANDARD ANALOG-TO-DIGITAL DATA CONVERSION

BACKGROUND

Digital subscriber line (DSL) and other communication technologies can be utilized to provide relatively high-speed data transmission utilizing existing infrastructure such as existing telephone lines and wireless networks.

BRIEF DESCRIPTION OF THE DRAWINGS

The detailed description is described with reference to the accompanying figures. In the figures, the left-most digit(s) of a reference number identifies the figure in which the reference number first appears. The use of the same reference numbers in different figures may, where feasible, indicate similar or identical items.

DETAILED DESCRIPTION

Overview

The described concepts relate to digital subscriber line (DSL) and other communications scenarios. In DSL scenarios, data is represented in analog form on a portion of a DSL system and in a digital form on another part of the system. Multiple different DSL (hereinafter, "x-DSL") standards with varying capabilities exist and/or are under development for conveying the data. For convenience and simplicity, implementations will be described herein with regard to x-DSL standards, although implementations to accommodate other communications standards are within the scope of this discussion.

The described concepts enable relatively efficient analog-to-digital conversion in a DSL or other communication system in accordance with a specified standard, such as the x-DSL standard. For instance, some implementations include a single configurable circuit that employs first and second sigma delta converters. The configurable circuit can be termed a configurable multi-stage noise shaping (MASH) circuit since in some configurations noise from the first sigma delta converter (hereinafter, "first stage") is input or cascaded into the second sigma delta converter (hereinafter, "second stage"). The second stage serves to reduce and/or eliminate noise from the circuit's digital output.

Exemplary configurable MASH circuits can convert analog signals into digital signals consistent with several different x-DSL standards. For instance, the configurable MASH circuit can be configured to handle different x-DSL standards by including or alternatively bypassing one of the sigma delta converters and/or portions (i.e., components) of one of the sigma delta converters. Another aspect of the configurable MASH circuit is that processing coefficients of the circuit can be adjusted to correspond to an individual x-DSL standard.

Exemplary Operating Environment

Figure 1:
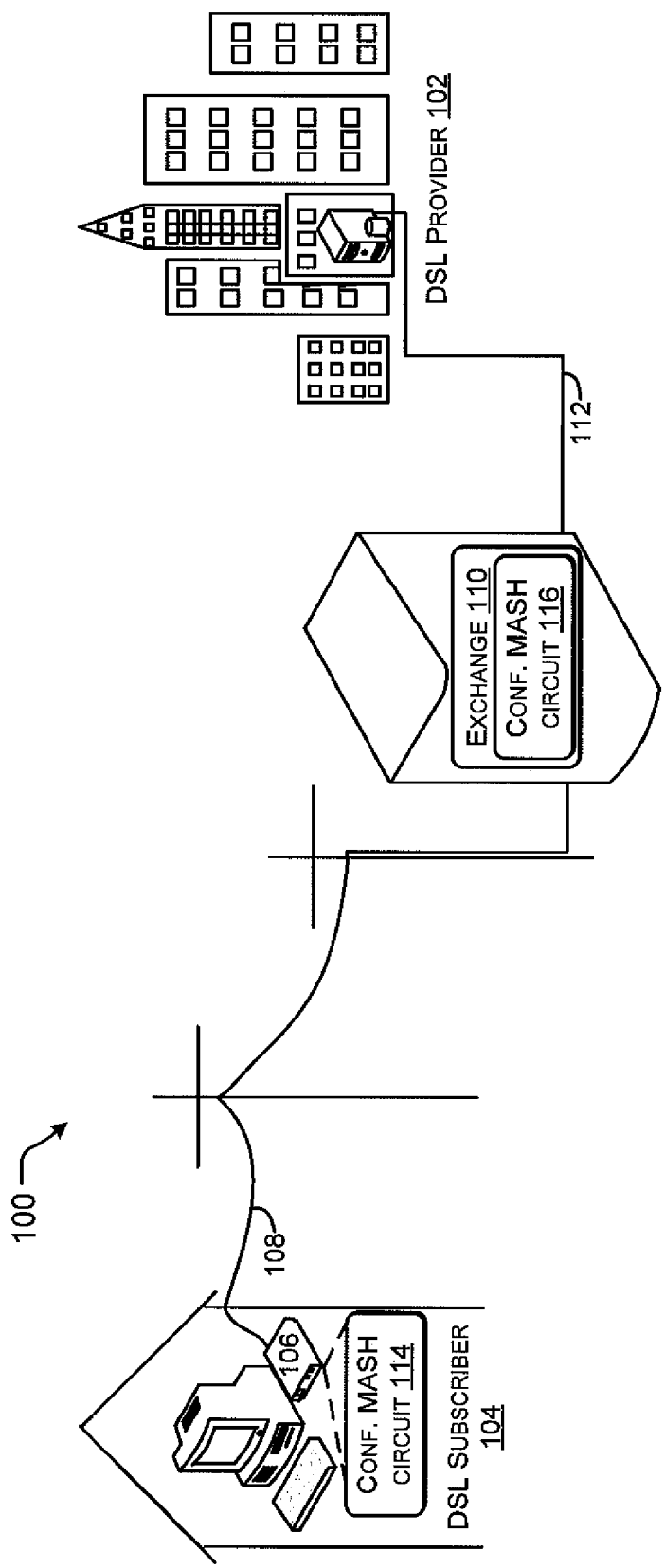
FIG. 1 shows a system in which a configurable MASH circuit can be employed in accordance with some implementations.

FIG. 1 illustrates an operating environment or system 100 in which the exemplary concepts can be applied. In this case, system 100 includes a digital subscriber line (DSL) provider 102 and a DSL subscriber or consumer 104. The DSL provider provides to the DSL subscriber a data communication service that is often utilized for high-speed access to the internet. There are many different DSL (x-DSL) standards with varying capabilities. A listing of examples of various standards is provided below in relation to Table 1. A general trend is toward higher bandwidth standards that enable higher data transmission rates. In this example, system 100 further includes a modem 106, a subscriber line in the form of a conductive twisted pair telephone line 108, an exchange 110 and a backbone line 112. Modem 106 contains a configurable MASH x-DSL analog-to-digital conversion circuit (configurable MASH circuit) 114 to achieve analog-to-digital conversion of inward bound data as seen from the perspective of the DSL subscriber 104. Similarly, exchange 110 includes a configurable MASH circuit 116 that achieves analog-to-digital conversion of incoming data. The configurable MASH circuits employed on modem 106 and exchange 110 allow analog data to exist on telephone line 108 while the remainder (or at least other portions) of system 100 operates with digital data.

The configurable MASH circuits 114, 116 can handle x-DSL standards including higher bandwidth DSL standards such as various asymmetric digital subscriber line (ADSL), high bit rate digital subscriber line (HDSL) and very high bit rate digital subscriber line (VDSL) standards, among others. In at least some configurations, the configurable MASH circuit is manifest as a single circuit on a single chip. A chip that includes a configurable MASH circuit for achieving analog-to-digital conversion in accordance with various x-DSL standards can have various manufacturing, cost, reliability, and/or power consumption advantages when compared to other potential solutions. Portions of the configurable MASH circuit can be enabled or disabled to handle data conversion in accordance with individual x-DSL standards. Alternatively or additionally, various components of the configurable MASH circuits 114, 116 operate in accordance with various processing coefficients that can be adjusted to correspond to specific x-DSL standards to allow a single circuit to handle a plurality of x-DSL standards. Of course, operating system 100 is but one of many systems to which the inventive concepts can be employed.

Exemplary Circuits

Figure 2:
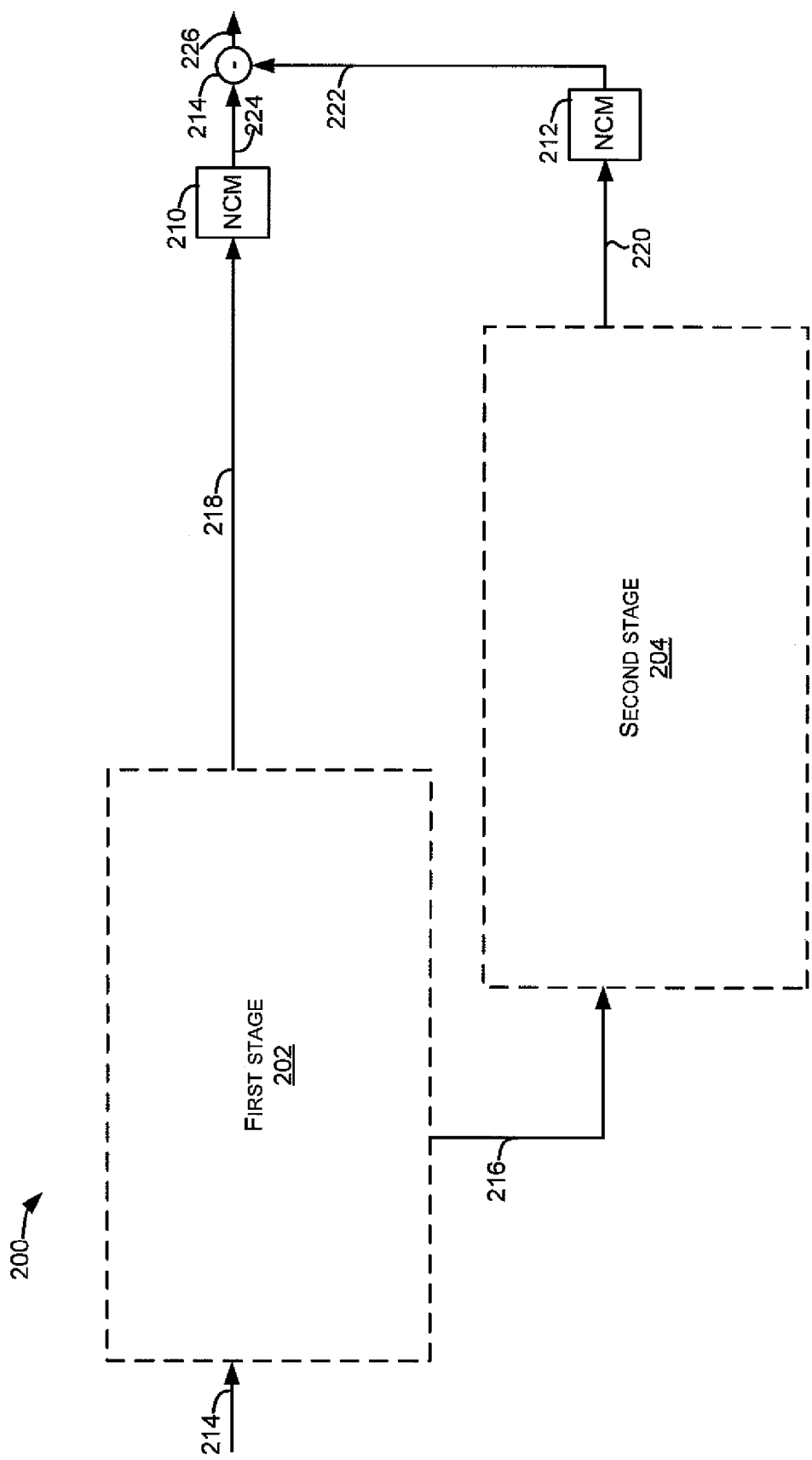
FIGS. 2-6 show schematic representations of configurable MASH circuits in accordance with some implementations.

FIG. 2 shows an exemplary configurable MASH circuit 200 for accomplishing analog-to-digital conversion consistent with a plurality of x-DSL or other communication standards. Configurable MASH circuit 200 is similar to the configurable MASH circuits 114, 116 introduced above in relation to FIG. 1. Configurable MASH circuit 200 includes multiple cascading sigma delta converters. In this case, configurable MASH circuit 200 includes a first stage configurable sigma delta converter (first stage) 202 operable to cascade into a second stage configurable sigma delta converter (second stage) 204. Other implementations may employ more or less than two stages. For example, either the first stage or second stage may be utilized as a single stage circuit or may be used in combination with the one or more other stages. In the example implementation shown in FIG. 2, configurable MASH circuit 200 also includes two noise cancelling mechanisms (NCM) 210, 212 and a subtraction mechanism 214.

The first and second stages 202, 204 are configurable in that various processing coefficients of the stages and/or a clock frequency can be adjusted in accordance with a selected or specific x-DSL standard. Examples of the adjustable coefficients are described in more detail below in relation to FIGS. 3-5.

In operation, an analog input signal is received at the first stage 202 as indicated at 214. The first stage 202 processes the analog signal utilizing processing coefficients adjusted for a specific x-DSL standard. The first stage processes the analog input signal and, in so doing, introduces noise into the process. At least one function of the second stage is to reduce this noise in the configurable MASH circuit's corresponding digital output. For instance, one source of noise introduced by the first stage is quantization noise or quantization error. The second stage 204 can reduce this quantization error. To this end, the noise from the first stage is cascaded into the second stage 204 as indicated generally at 216.

The second stage 204 processes the input noise 216 utilizing processing coefficients that are adjusted for the specific x-DSL standard. First stage 202 produces digital output 218 that is directed to NCM 210. Second stage 204 produces digital output 220 that is directed to NCM 212. The NCMs 210, 212 utilize processing coefficients corresponding to the specific x-DSL standard. Output 222 of NCM 212 is subtracted from output 224 of NCM 210 by the subtraction mechanism 214 to generate the configurable MASH circuit's digital output 226. In this case, changing the processing coefficients can be thought of as changing a mode of the configurable MASH circuit.

Considered another way, the first stage 202 introduces quantization noise into the signal as a byproduct of the analog-to-digital conversion process. The second stage 204 contributes to removing the quantization noise introduced by the first stage. More specifically, the second stage, in combination with NCMCs 210, 212 and subtractor 214, serves to reduce the quantization noise from the first stage. Generally speaking only the quantization noise or error from the second stage remains in output 226. Further, the quantization error of the second stage is highly attenuated by NCM 212 such that the remaining quantization noise does not significantly diminish the quality of output 226. Employing first and second stages 202, 204 can allow a relatively simple and stable circuit (i.e., configurable MASH circuit 200) to achieve a digital output signal with a greater dynamic range than can be achieved with a single stage. Further, as will be explained in more detail below in relation to FIGS. 3-6, the two stages can tune the noise to a specific frequency or range of frequencies that are different from frequencies utilized to convey the data.

Figure 3:
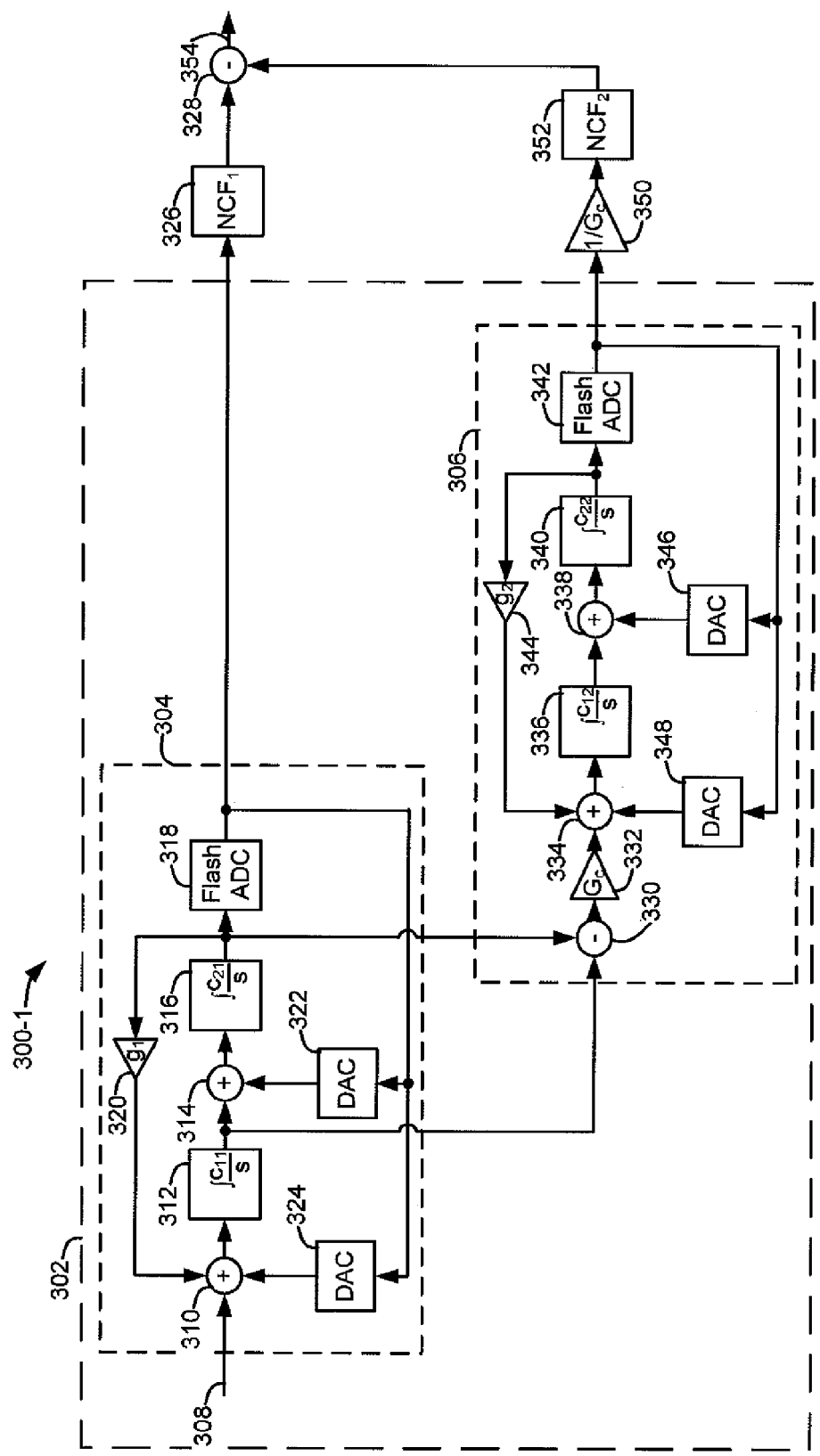
Figure 4:
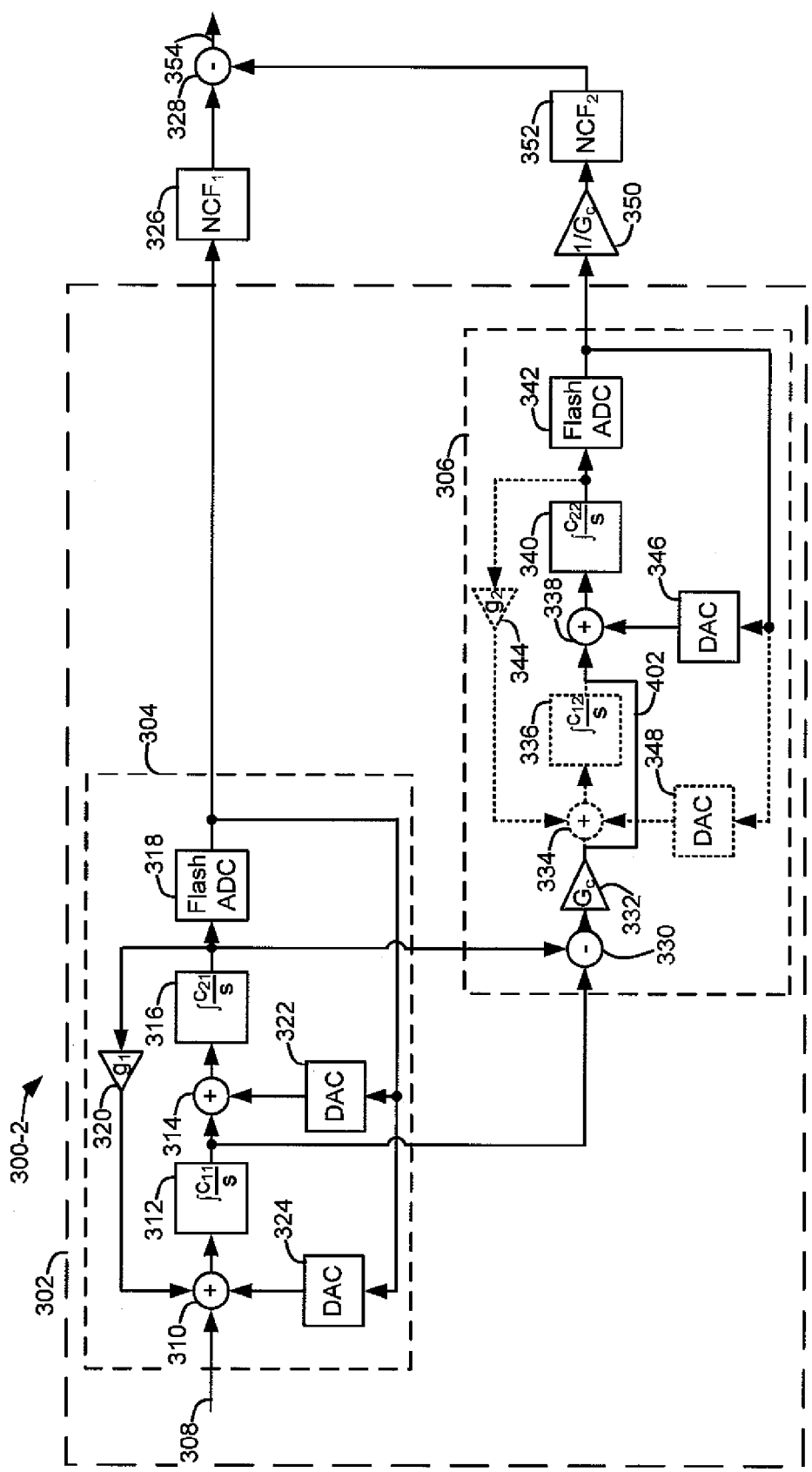
Figure 5:
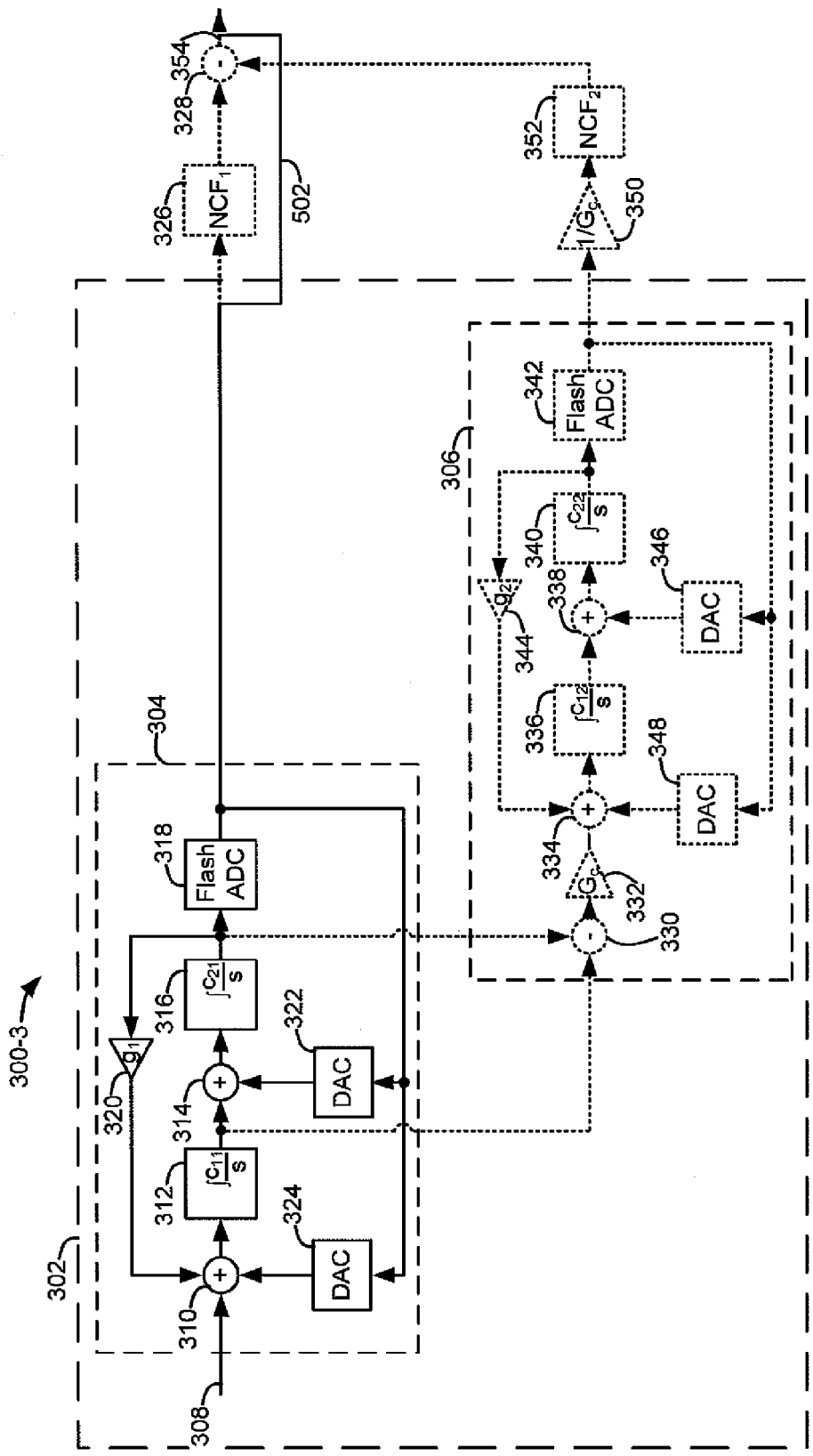

FIGS. 3-5 collectively show an exemplary configurable MASH circuit 300 for analog-to-digital conversion of signals in accordance with a plurality of x-DSL standards.

FIGS. 3-5 show a configurable MASH circuit 300 in three different configurations for accomplishing analog-to-digital conversion in accordance with different x-DSL standards. FIG. 3 shows the configurable MASH circuit 300-1 in a first configuration for handling a first x-DSL standard. FIG. 4 shows the configurable MASH circuit 300-2 in a second configuration for handling a second x-DSL standard. FIG. 5 shows the configurable MASH circuit 300-3 in a third configuration for handling a third x-DSL standard.

For purposes of explanation, the components of MASH circuit 300 are introduced in relation to FIG. 3. Next, configurable MASH circuit changes are introduced in relation to the configurations of FIGS. 4-5 relative to the configuration of FIG. 3. Information relating to these configurations is also conveyed in Table 1. Finally, processing coefficients employed in reconfiguring the configurable MASH circuit 300 are introduced in Table 2. In summary, configurable MASH circuit 300 is configurable in at least two ways. First, individual circuit stage and/or components of stages can be activated or inactivated to operate with various x-DSL standards. Second, processing coefficients of individual components can be adjusted to operate with various x-DSL standards.

For purposes of explanation, configurable MASH circuit 300 is divided generally into analog and digital portions where analog portions are contained within dashed rectangle 302 and digital portions lie outside the dashed rectangle 302. Several components of the configurable MASH circuit have adjustable processing coefficients that are adjustable to correlate to individual DSL modes. These processing coefficients are discussed below in relation to Tables 1 and 2 after introduction of the configurable MASH circuit's components.

In this implementation, configurable MASH circuit 300 includes first and second stages 304, 306. Other implementations may include additional stages. First stage 304 is operable to receive analog input at 308. In this implementation, the first stage includes an adder 310, an integrator 312, another adder 314, another integrator 316, and a flash analog-to-digital converter (ADC) 318. In this case, the first stage 304 further includes a feedback element 320, two digital-to-analog converters (DAC) 322, 324, a noise cancellation filter (NCF) 326, and a subtractor 328.

In this case, the second stage 306 includes a subtractor 330, a first amplifier 332, a first adder 334, a first integrator 336, a second adder 338, a second integrator 340, a flash ADC 342, a feedback element 344, two DACs 346, 348, a second amplifier 350, and an NCF 352.

In operation, analog input 308 is received at adder 310 along with output from feedback element 320 and DAC 324. Adder 310 generates a summation of the received input and delivers the summation to integrator 312. Integrator 312 is connected to adder 314 and also to subtractor 330 of the second stage 306. Adder 314 generates a summation of the signals received from integrator 312 and a feedback signal received from DAC 322. The summation from adder 314 is delivered to integrator 316. Output from integrator 316 is fed to flash ADC 318, feedback element 320, and subtractor 330. Feedback element 320 is connected to adder 310 as mentioned above. The feedback element 320 functions to shape quantization noise to get the quantization noise outside a specified frequency bandwidth.

Flash ADC 318 converts the signal into a digital form which is then delivered to DACs 322, 324, and NCF 326. The output of NCF 326 is connected to subtractor 328. In the first stage 304, analog-to-digital processing of the signal introduces noise into the signal. The noise (e.g., quantization noise/error) can be generated by various process of the first stage, such as the quantization process. The quantization noise of the first stage 304 is removed by the combination of $NCF_1$ 326, $NCF_2$ 352 and the subtraction mechanism 328. At the output 354 only the quantization error of the second stage 306 is left, but it is highly attenuated by the processing done in NCF 352. In this instance, output from each of integrators 312, 316 is sent to the second stage 306 to address the introduced noise.

Looking to second stage 306, subtractor 330 receives signals from integrators 312 and 316. Subtractor 330 sends a signal representing the difference between the received signals to amplifier 332. The opposite side of amplifier 332 is connected to adder 334. The adder 334 also receives input from feedback element 344 and DAC 348. Adder 334 creates a summation that is delivered to integrator 336. Output from integrator 336 is directed to adder 338. The adder 338 also receives input from DAC 346 and creates a summation of these two inputs which is delivered to integrator 340. In this configuration, integrator 336 and feedback element 344 can function as an analog filter. Output from integrator 340 is supplied to flash ADC 342 and feedback element 344. Flash ADC 342 generates a digital signal that is sent to DACs 346, 348 and amplifier 350. The opposite side of DACs 346, 348 is connected to adders 338, 334 respectively.

Output from amplifier 350 is routed to noise cancellation filter 352. Output of noise cancellation filter 352 is delivered to subtractor 328. The circuit's digital output 354 is generated by subtractor 328 as the difference of the signals received from the first and second stages 304, 306.

FIG. 4 shows configurable MASH circuit 300-2 configured to handle analog-to-digital conversion according to a second mode or standard. In this case, several components of second stage 306 are inactivated or bypassed. Specifically, adder 334, integrator 336, feedback element 344, and DAC 348 are bypassed in this configuration and, as such, are shown in dotted lines in FIG. 4 for the reader's convenience. Further, the output of amplifier 332 is directly connected to adder 338 as indicated at 402. A technique for enabling or disabling components to achieve different configurable MASH circuit configurations is described below in relation to FIG. 6.

FIG. 5 shows a third configuration for handling still another x-DSL mode or standard. According to this configuration of configurable MASH circuit 300-3, all of the components of second stage 306 are bypassed. Further, noise cancellation filter 326 and subtractor 328 are bypassed. As with FIG. 4, the bypassed components are shown in dotted rather than solid lines. In this configuration the output of flash ADC 318 becomes the circuit's digital output 354 as indicated by arrow 502.

Table 1 lists examples of some example x-DSL modes for which configurable MASH circuit 300 can be configured. Individual modes correspond to individual bandwidths. For example, one or more x-DSL standards can utilize the bandwidth of an individual mode. Therefore, adjusting configurable MASH circuit 300 to an individual mode allows the circuit to process data for x-DSL standards that employ the bandwidth specified by the mode.

TABLE 1

| Mode | Clock Freq. (MHz) | Bandwidth (MHz) | DR (ENOBs) | Type/Order | Configuration |
|---|---|---|---|---|---|
| VDSL5 | 282.624 | 5 | 11 | 2nd order | Third (FIG. 5) |
| VDSL12 | 282.624 | 12 | 11 | MASH 2-1 | Second (FIG. 4) |
| VDSL17 | 282.624 | 17 | 11 | MASH 2-2 | First (FIG. 3) |
| VDSL30 | 565.248 | 30 | 11 | MASH 2-2 | First (FIG. 3) |

In Table 1, the mode column indicates specific x-DSL modes to which configurable MASH circuit 300 can be applied. Each mode may correspond to one or more x-DSL standards. The listed modes are provided for purposes of example and the concepts described herein can be applied to other modes that are not listed. The clock frequency column relates to the frequency of a reference clock employed in the conversion process. The reference clock is designated with specificity in relation to FIG. 6. The bandwidth column relates to the available bandwidth in accordance with a specific x-DSL standard. The type/order column indicates the number of stages that are active in a given configuration and the lowest number of integrators employed at any stage as will be described in more detail below. The configuration column correlates individual modes to specific configurations of configurable MASH circuit 300. Stated another way, the configuration column conveys which components of the configurable MASH circuit are activated in respect to a specific mode. Adjusting the configurable MASH circuits to configurations that correspond to particular modes allows the circuit to handle various x-DSL standards.

As can be appreciated from Table 1, FIG. 3 shows the configurable MASH circuit 300-1 configured to process analog signals according to the VDSL17 and VDSL30 modes represented on the last two rows of Table 1. FIG. 4 shows the configurable MASH circuit 300-2 in a second configuration for handling the VDSL12 mode represented on the second row of Table 1. FIG. 5 shows the configurable MASH circuit 300-3 in a third configuration for handling the VDSL5 mode listed on the first row of Table 1.

FIG. 3 offers an example where configurable MASH circuit 300-1 employs two stages and two integrators at each stage, hence the "MASH 2-2" designation in Table 1. In comparison, FIG. 4 shows a configuration where both stages 304 and 306 are activated, but in the second stage 306 only a single integrator is activated, hence the "MASH 2-1" designation in Table 1. In the configuration of FIG. 5 only the first stage 304 is activated. The first stage employs two integrators and, as such, offers second order noise quantization as conveyed in Table 1.

Configurable MASH circuit 300 is also configurable in that processing coefficients of various components of the circuit can be adjusted to handle various x-DSL standards. For instance, Table 2 includes an example listing of processing coefficient values of several components.

TABLE 2

| Mode | $C_{11}$ | $C_{21}$ | $g_1$ | $C_{12}$ | $C_{22}$ | $g_2$ |
|---|---|---|---|---|---|---|
| VDSL5 | 0.5011 | 0.8226 | 0.0163 | — | — | — |
| VDSL12 | 0.4054 | 0.7213 | 0.0336 | — | 0.74 | — |
| VDSL17 | 0.4054 | 0.7305 | 0.2125 | 3.2432 | 0.7305 | 0.0266 |
| VDSL30 | 0.2281 | 0.6862 | 0.1071 | 1.8248 | 0.6862 | 0.0134 |

The coefficients of Table 2 are located in FIGS. 3-5 in relation to specific components employing the coefficients. For instance, coefficients $c_{11}$, $c_{21}$, $c_{12}$, and $c_{22}$ are associated with integrators 312, 316, 336, and 340, respectively. Similarly, coefficients $g_1$, $g_2$ are associated with feedback elements 320, 344 respectively. The coefficient values can be adjusted to enable configurable MASH circuit 300 to handle different x-DSL standards. For instance, according to Table 1, both the VDSL17 and VDSL30 standards utilize the first configuration of the configurable MASH circuit shown in FIG. 3. However, Table 2 shows that the $c_{21}$, $c_{12}$, $c_{22}$ $g_1$, and $g_2$ coefficient values are adjusted in the configurable MASH circuit to handle one of the two standards. For instance, the $C_{11}$ coefficient value of integrator 312 is set at 0.4054 according to Table 2 for the VDSL17 mode and the value is set at 0.2281 for the VDSL30 mode. Further, in Table 2, coefficients of components that are inactivated in a specific configuration are not provided a value as indicated by a double dash ("--"). For instance, according to Table 1, the VDSL5 mode utilizes the configuration shown in FIG. 5 where the feedback element 344 is inactivated. Correspondingly, no value is indicated in Table 2 for $g_2$ in relation to the VDSL5 mode. In some implementations the coefficient values are programmable for configurable MASH circuit 300. Such implementations lend themselves to handling new x-DSL standards since new coefficient values that correlate to the new standard can be readily added to the configurable MASH circuit 300.

Figure 6:
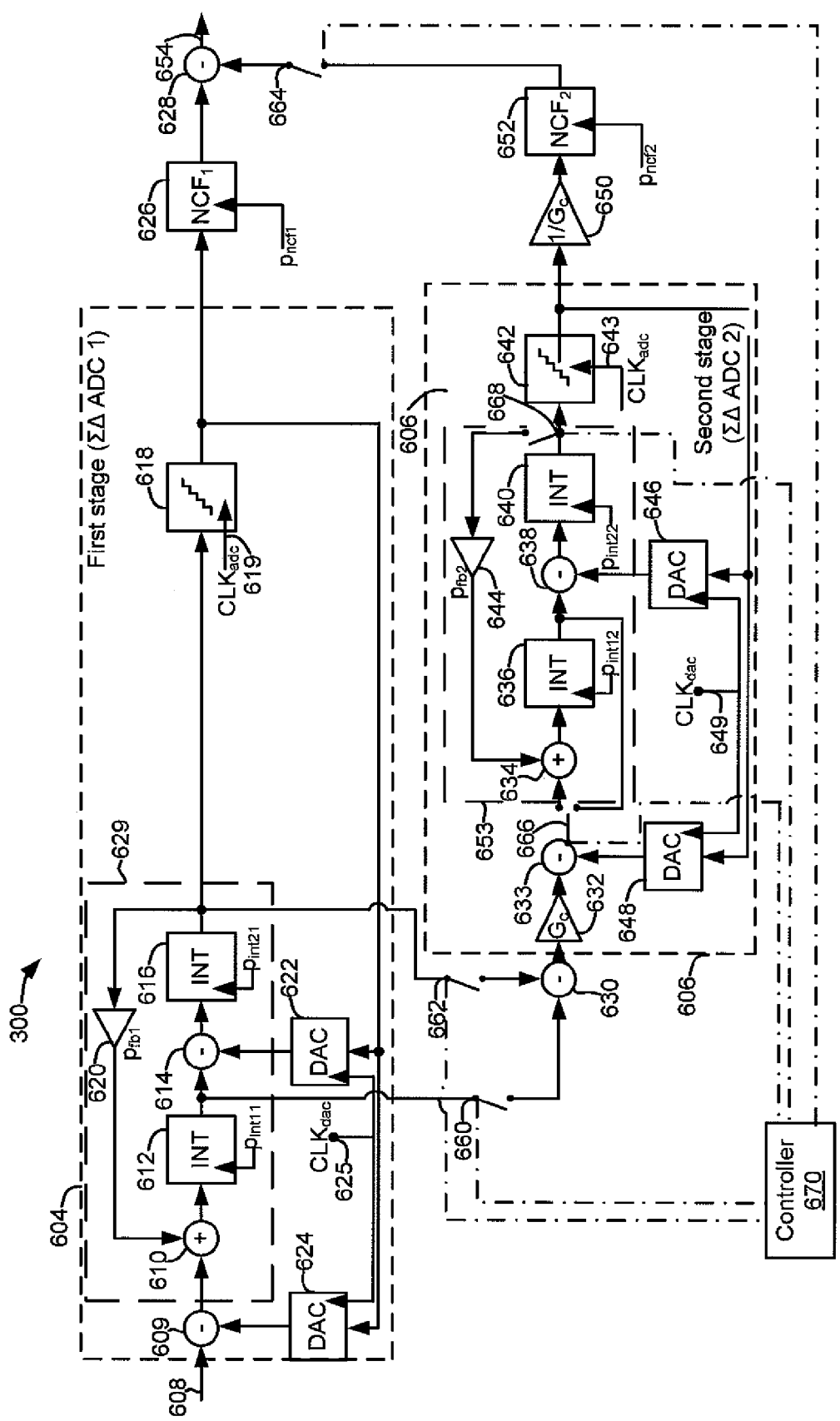

FIG. 6 shows another exemplary configurable MASH circuit 600 for analog-to-digital conversion of signals in accordance with multiple different x-DSL standards. Tables 1 and 2 are applicable to configurable MASH circuit 600 consistent with the discussion above in relation to FIGS. 3-5. In this implementation, configurable MASH circuit 600 includes first and second sigma delta ADC stages 604, 606. First stage 604 is operable to receive analog input at 608. In this implementation, the first stage includes a first subtractor 609, an adder 610, a first integrator 612, a second subtractor 614, a second integrator 616, a quantizer 618, and an ADC clock input 619. In this case, the first stage further includes a feedback element 620, two digital-to-analog converters (DAC) 622, 624, DAC clock input 625, a noise cancellation filter 626, and a subtractor 628. The adder 610, integrators 612, 616, subtractor 614, and feedback element 620 can collectively operate as an analog loop filter 629.

In this implementation, the second stage 606 includes a first subtractor 630, an amplifier 632, a second subtractor 633, an adder 634, a first integrator 636, a third subtractor 638, a second integrator 640, a quantizer 642, an ADC clock input 643, a feedback element 644, two DACs 646, 648, DAC clock input 649, another amplifier 350, and a noise cancellation filter 652. Adder 634, integrators 636, 640, subtractor 638, and feedback element 644 can collectively operate as an analog loop filter 653.

In operation, analog input 608 is received at subtractor 609 along with output from DAC 624. The opposite side of the subtractor is connected to adder 310 that generates a summation of the received input from the subtractor and from feedback element 620. Adder 610 delivers the summation to integrator 612. Integrator 612 processes the received input from the adder. The output of integrator 612 is connected to subtractor 614 and also to subtractor 630 of the second stage 606. Subtractor 614 generates a difference of the signals received from integrator 612 and a feedback signal received from DAC 622. The summation from subtractor 614 is delivered to integrator 616. Output from integrator 616 is fed to quantizer 618, feedback element 620, and subtractor 630. Feedback element 620 is connected to adder 610 as mentioned above. Quantizer 618 receives output from integrator 616 and ADC clock input 619 and produces a signal that is delivered to NCF 626, and fed back to DACs 622, 624. The output of NCF 626 is connected to subtractor 628.

Looking at the second phase 606, subtractor 630 receives signals from integrators 612 and 616. Subtractor 630 sends a difference between the received signals to amplifier 632. The opposite side of amplifier 632 is connected to subtractor 633 which produces a signal representing the difference from the input received from amplifier 632 and DAC 648. The difference signal produced by subtractor 633 is sent to adder 634 which also receives input from feedback element 644. Adder 634 creates a summation that is delivered to integrator 636. Output from integrator 636 is directed to subtractor 638. The subtractor 638 also receives input from DAC 646 and creates a summation of these two inputs which is delivered to integrator 640. Output from integrator 640 is supplied to quantizer 642 and feedback element 644. Quantizer 642 generates a digital signal that is sent to DACs 646, 648 and buffer/amplifier 650. The opposite side of DACs 646, 648 is connected to subtractors 633, 638 respectively.

Output from buffer/amplifier 650 is routed to noise cancellation filter 652. Output of noise cancellation filter 652 is delivered to subtractor 628. The circuit's digital output 654 is generated by subtractor 628 as the difference of the signals received from the first and second stages 604, 606.

Configurable MASH circuit 600 can be configured by activating or inactivating various components. For instance, second stage 606 can be inactivated utilizing single pole single throw switches 660, 662, 664, and 668. Similarly, single pole double throw switch 666 and single pole single throw switch 668 allow adder 634, integrator 636 and feedback element 644 to be activated or inactivated. In some implementations, controllable switches can be employed to allow automatic control of the switches in accordance with various programming instructions. For instance, in this implementation, switches 660-668 are communicably coupled to a controller 670 that can control the switches in accordance with programming instructions executed by the controller. Although not specifically shown, controller 670 can be communicably coupled to various components to adjust processing coefficients operating thereon. For instance, the controller can be communicably coupled to the components that utilize the coefficients of Table 2 as described above in relation to FIGS. 3-5. Processing coefficients $p_{int11}$, $p_{int12}$, $p_{int21}$, and $p_{int22}$ can be controlled by controller 670 to program the corresponding circuit components 612, 636, 616, and 640, respectively.

Figure 7:
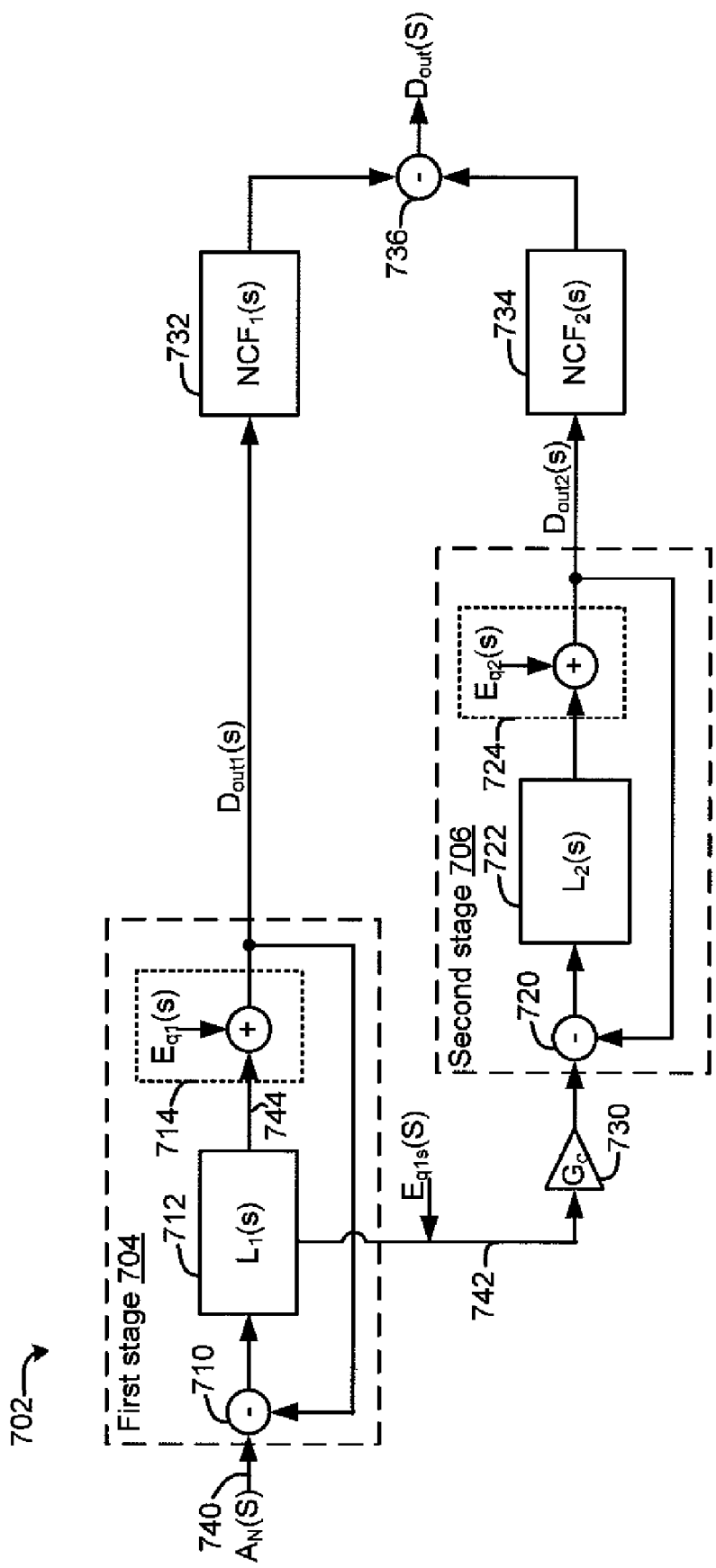
FIG. 7 shows a schematic representation of a configurable MASH circuit in accordance with some implementations.

FIG. 7 shows a simplified and linearized model of a configurable MASH circuit 702 in accordance with one implementation. An explanation of several of the inventive concepts is described below in relation to configurable MASH circuit 702.

Configurable MASH circuit 702 includes first and second stages 704, 706. The first stage includes a subtractor 710, a loop filter 712, and a quantizer 714. Second stage 706 includes a subtractor 720, a loop filter 722, and a quantizer 724. Configurable MASH circuit 702 also includes an amplifier 730, a pair of NCFs 732, 734 and a subtractor 736.

Analog input is received at subtractor 710 as indicated at 740. Subtractor 710 determines a difference between the analog input and feedback received from an output of quantizer 714. The subtractor's output difference is sent to loop filter 712. Intermediate output 742 of loop filter 712 is sent to amplifier 730 and a final output 744 of loop filter 712 is sent to quantizer 714. The quantizer 714 adds the quantization noise $E_{q1}(s)$ to the input received from loop filter 712 to produce output $D_{out1}(s)$ that is delivered to NCF 732 and fed back to subtractor 710. Output from NCF 732 is sent to subtractor 736.

In relation to the second stage, amplifier 730 receives input from the first stage 704 and produces output that is directed to subtractor 720. The subtractor 720 also receives feedback from quantizer 724 that is subtracted from the amplifier's output to produce a difference signal that is delivered to loop filter 722. The loop filter 722 generates output that is sent to quantizer 724. The quantizer adds the quantization noise $E_{q2}(s)$ to the output of loop filter 722 to produce a summation $D_{out2}(s)$ that is fed back to subtractor 820 and that is also directed to NCF 734. Output from NCF 734 is subtracted from output from NCF 732 by subtractor 736 to produce digital output signal $D_{out}(s)$.

In each stage, the quantizer is modeled as a noise source added to the output of the loop filter. Hence, in the first stage 704, quantizer 714 acts as a noise source for loopfilter 712 via the feedback signal that is delivered to subtractor 710. In the second stage 706, quantizer 724 acts as a noise source for loopfilter 722 via the feedback signal that is delivered to subtractor 720. For ease of explanation the feedback DACs described above in relation to FIGS. 2-6 are not shown. Instead, the DACs are assumed to have a gain of "1". Further, in this linearized model, all signals are assumed to be in continuous-time. (In reality, the outputs of the first and second stages 704, 706 are digital in nature, but the linear model description of this implementation is provided as an aid to understanding the NCF digital filters. Moreover, the linear model avoids complex mathematical derivations, which are not critical to the understanding and practice of this implementation and which tend to be well understood by the skilled artisan).

The input to the second stage 706 is a signal which represents an estimation of the quantization noise in the first stage:

$$E_{q1} \approx E_{q1s}(s)$$

The outputs of each stage can be calculated as a function of the signal and noise transfer functions of the stage:

$$D_{OUT1}(s) = A_{IN}(s) \cdot STF_1(s) + E_{q1}(s) \cdot NTF_1(s)$$

$$D_{OUT2}(s) = E_{q1s}(s) \cdot G_c \cdot STF_2(s) + E_{q2}(s) \cdot NTF_2(s)$$

Where the signal and noise transfer functions are:

$$STF_1(s) = \frac{1}{1 + \frac{1}{L_1(s)}}$$

$$NTF_1(s) = \frac{1}{1 + L_1(s)}$$

$$STF_2(s) = \frac{1}{1 + \frac{1}{L_2(s)}}$$

$$NTF_2(s) = \frac{1}{1 + L_2(s)}$$

The two outputs are then filtered and subtracted from each other to eliminate the quantization error from the first stage:

$$D_{OUT}(s) = D_{OUT1}(s) \cdot NCF_1(s) - \frac{1}{G_c} \cdot D_{OUT2}(s) \cdot NTF_2(s)$$

In the ideal case, where:

$$E_{q1}(s) = E_{q1s}(s)$$

the following equation, when true, allows for elimination of the quantization error from the first stage:

$$E_{q1}(s) \cdot NTF_1(s) \cdot NCF_1(s) = E_{q1}(s) \cdot STF_2(s) \cdot NTF_2(s)$$

The above equation leads to:

$$NCF_1(s) = STF_2(s)$$

$$NCF_2(s) = NTF_1(s)$$

The above terms are introduced in conjunction with FIG. 7 and are applicable thereto. In this instance, because the STF and NTF transfer functions depend on the loop filter transfer functions, and these change for the different modes, the NCFs also change for the different modes. (In practice, the NCF filters are digital filters which approximate the analog transfer functions). These concepts contribute to the configurable MASH circuit achieving analog-to-digital conversion of x-DSL standards with enhanced signal characteristics compared to existing solutions.

Operation

Figure 8:
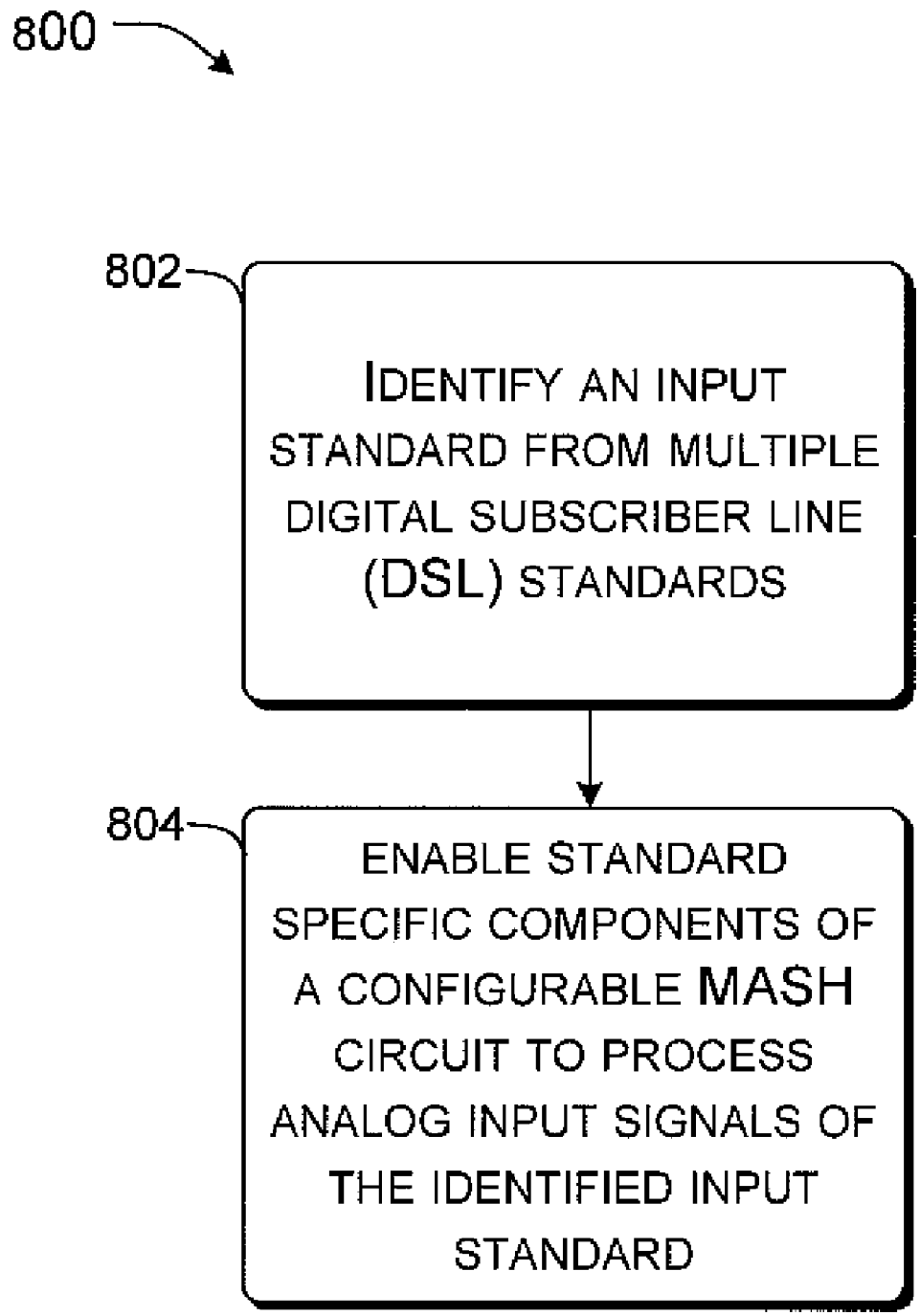
FIG. 8 is an exemplary method for implementing multi-standard DSL analog-to-digital data conversion in accordance with at least some implementations.

FIG. 8 shows an exemplary method or technique 800 for accomplishing analog-to-digital conversion of x-DSL standards. This method 800 may be implemented in connection with any suitable devices and/or systems. Non-limiting examples of devices and/or systems upon which the method can be implemented are described above in relation to FIGS. 1-7.

The order in which the method 800 is described is not intended to be construed as a limitation, and any number of the described blocks can be combined in any order to implement the method, or an alternate method. Furthermore, the methods can be implemented in any suitable hardware, software, firmware, or combination thereof such that a computing device can implement the method. In one case, the method is stored on a computer-readable storage media as a set of instructions such that execution by a processor or controller, causes the method to be performed.

At block 802, an input standard from multiple x-DSL standards is identified. The input standard relates to which x-DSL standard is being utilized for data transmission over a DSL system at a particular time. In some instances, a technician for the DSL provider can identify the standard and set the configurable MASH circuitry accordingly. In other instance, the DSL subscriber can identify the standard such as by making adjustments to the subscriber's modem. In still other instances, various techniques can be employed that allow the x-DSL standard to be identified automatically by a device such as a modem or exchange that incorporates an exemplary configurable MASH circuit. For instance, an identification signal can be sent to the device that indicates what x-DSL standard is being employed. In another instance, the device can automatically evaluate received x-DSL signals to determine which standard is being utilized.

At block 804, standard specific components of the configurable MASH circuit are enabled to process analog input signals of the identified input standard. The enabling can comprise adjusting various processing coefficients utilized by components of the configurable MASH circuit. In some instances, the enabling includes enabling or alternatively disabling or bypassing entire stages of the configurable MASH circuit. In still other implementations, individual components of the MASH circuit are disabled while all of the stages remain activated. Still other implementations can enable specific components by adjusting their respective processing coefficients and can enable (or disable) other MASH components to achieve a configuration that corresponds to a specific x-DSL standard.

CONCLUSION

Although the subject matter has been described in language specific to structural features and/or methodological acts for accomplishing analog-to-digital conversion of x-DSL standards, it is to be understood that the inventive concepts defined in the appended claims are not necessarily limited to the specific features or acts described. Rather, the specific features and acts are disclosed as examples that implement the inventive concepts.

What is claimed is:

1. A circuit, comprising:
    at least first and second sigma delta converters for processing signals of multiple digital subscriber line (DSL) standards, wherein:
        in a first configuration the circuit processes signals of a first DSL standard utilizing either of the first and the second sigma delta converters;
        in a second configuration the circuit processes signals of a second DSL standard utilizing the first sigma delta converter cascaded into the second sigma delta converter; and in a third configuration the circuit is configured to bypass a set of components in the second sigma delta converter to process signals of a third DSL standard.

2. The circuit of claim 1, wherein the set of components comprise a digital-to-analog converter and an analog filter that comprises an integrator, and a feedback element 3. The circuit of claim 1, wherein in the second configuration quantization noise of the first sigma delta converter is cascaded into the second sigma delta converter and a digital output of the circuit is derived from an output of the second sigma delta converter subtracted from an output of the first sigma delta converter.

4. The circuit of claim 1, wherein in relation to the second DSL standard the circuit is configured to bypass a set of components of the second sigma delta converter and subtract a digital output of the second sigma delta converter from a digital output of the first sigma delta converter to produce the circuit's digital output.

5. The circuit of claim 1, wherein each of the first and second sigma delta converters include a pair of serially arranged integrators, a feedback loop to form a resonator together with the integrators, and a clock input, and wherein the circuit can be tuned to a particular standard by adjusting a frequency of the clock input and coefficients of the respective integrators and resonator.

6. The circuit of claim 1, wherein each of the first and second sigma delta converters include a pair of integrators, a feedback loop, and a clock input, and wherein in relation to the first standard the second sigma delta converter is bypassed and the circuit is tuned by adjusting a frequency of the clock input and coefficients of the integrators and resonator of the first sigma delta converter and wherein in relation to the second standard quantization noise of the first sigma delta converter is cascaded to the second sigma delta converter and the circuit is tuned by adjusting a frequency of the clock input and coefficients of the integrators and resonator of both of the first and second sigma delta converters.

7. The circuit of claim 6, wherein in relation to a third standard quantization noise of the first sigma delta converter is fed to the second sigma delta converter where the feedback loop and one of the integrators is bypassed and the circuit is tuned by adjusting a frequency of the clock input and coefficients of the integrators and resonator of the first sigma delta converter and a frequency of the clock input and coefficient of the non-bypassed integrator of the second sigma delta converter.

8. The circuit of claim 1 embodied on a device comprising one of a DSL modem and a DSL exchange.

9. A device, comprising:
a circuit comprising at least first and second sigma delta converters for processing analog input signals selected from one of multiple digital subscriber line (x-DSL) standards, wherein to process at least one of the standards, the analog input signals are received at the first sigma delta converter and quantization noise from the first sigma delta converter is processed by the second sigma delta converter and wherein digital output of the circuit is derived by subtracting an output of the second sigma delta converter from an output of the first sigma delta converter;
wherein each of the first and second sigma delta converters includes a pair of serially arranged integrators, a feedback loop, and a clock, and wherein the circuit can be tuned to a particular x-DSL analog input signal standard by adjusting a frequency of the clock and coefficients of the integrators and a resonator.

10. The device of claim 9, further comprising noise cancellation filters for cancelling noise in the output of the first and second sigma delta converters before the subtracting.

11. The device of claim 9, wherein the first sigma delta converter includes first and second serially arranged integrators for receiving the input signals and wherein the quantization noise is received at the second sigma delta converter as a difference between a first signal sampled from between the first and second integrators and a second signal sampled after the integrators.

12. A method, comprising:
identifying an input standard from multiple digital subscriber line (x-DSL) standards; and
enabling standard specific components of a configurable multistage noise shaping (MASH) circuit to process analog input signals of the identified input standard, wherein:
a first configuration of the MASH circuit processes signals of a first DSL standard utilizing either of a first and a second sigma delta converters,
a second configuration of the MASH circuit processes signals of a second DSL standard utilizing the first sigma delta converter cascaded into the second sigma delta converter, and
a third configuration the circuit bypasses a set of components in the second sigma delta converter to process signals of a third DSL standard.

13. The method according to claim 12, wherein the identifying comprises one or more of sampling the input signals to identify the standard, and receiving an indication that identifies the input standard.

14. The method according to claim 12, wherein the enabling comprises controlling one or more controllable switches that are electrically connected to the specific components according to computer readable programming instructions.

15. The method according to claim 12, wherein the enabling comprises enabling one or both of: a first stage of the configurable MASH circuit for processing input signals and a second stage of the configurable MASH circuit for processing quantization noise of the first stage.

16. The method according to claim 12, wherein the enabling for a first identified standard comprises enabling a first stage of the configurable MASH circuit for processing input signals to produce digital output corresponding to the analog input signals and not enabling a second stage of the configurable MASH circuit.

17. The method according to claim 12, wherein the enabling for a first identified standard comprises adjusting component specific processing coefficients corresponding to the identified input standard.

18. A device, comprising:
a circuit comprising at least first and second sigma delta converters for processing analog input signals selected from one of multiple communications standards, wherein:
in a first configuration the circuit processes signals of a first DSL standard utilizing either of the first and the second sigma delta converters,
in a second configuration the circuit processes signals of a second DSL standard utilizing the first sigma delta converter cascaded into the second sigma delta converter, and
in a third configuration the circuit is configured to bypass a set of components in the second sigma delta converter to process signals of a third DSL standard.

19. The device according to claim 18, wherein to process at least one of the standards, the analog input signals are received at the first sigma delta converter and quantization noise from the first sigma delta converter is processed by the second sigma delta converter and wherein digital output of the circuit is derived by subtracting an output of the second sigma delta converter from an output of the first sigma delta converter.

* * * * *